(12) United States Patent
Gilliland et al.

(10) Patent No.: US 6,767,157 B2
(45) Date of Patent: Jul. 27, 2004

(54) TOOLLESS FASTENING MECHANISM (75) Inventors: Don Alan Gilliland, Rochester, MN (US); James Larry Peacock, Aloha, OR (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/255,520

(22) Filed: Sep. 26, 2002

(65) Prior Publication Data

US 2004/0062597 A1 Apr. 1, 2004

(51) Int. Cl.[7] ................................................ A60R 9/048
(52) U.S. Cl. ..................... 403/374.1; 403/343; 403/321
(58) Field of Search .......................... 403/374.1, 322.4, 403/326, 327, 322.1, 329, 322.3, 374.2, 374.5, 373, 343, 321

(56) References Cited

U.S. PATENT DOCUMENTS

| 169,948 A | * | 11/1875 | Bond | ........................ 403/322.4 |
| 5,897,087 A | * | 4/1999 | Farley | .................... 248/229.21 |
| 6,494,351 B1 | * | 12/2002 | Dean | ........................... 224/324 |

* cited by examiner

Primary Examiner—John R. Cottingham
(74) Attorney, Agent, or Firm—Robert R. Williams (57) ABSTRACT Methods and apparatus disclosed for providing a fastener that can hold suitably flat planar objects. No tools are required to actuate the fastener. The fastener holds the object with a predetermined range of force, determined by a built-in spring when actuated. The fastener is particularly suited for fastening Printed Wiring Boards (PWBs) in an electronics enclosure, and holds the PWBs in position, as well as providing electrical coupling of a voltage supply used on the PWB to the electronic enclosure.

17 Claims, 12 Drawing Sheets

TOOLLESS FASTENING MECHANISM

FIELD OF THE INVENTION

The present invention relates to fastening mechanisms. In particular, the current invention is well suited for fastening printed wiring boards (PWBs) to mounting posts that are then attached to a frame of an electronic enclosure, or to another PWB.

DESCRIPTION OF RELATED ART

Modern electronic systems, in particular, computer systems, comprise one or more processors, controllers, memory, and input/output devices such as floppy disk drives, hard disk drives, compact disk drives, for examples. Electronic circuitry, logic elements, and memory circuitry implementing the parts of an electronic system are constructed on silicon, or other suitable semiconductor, chips. The chips are typically mounted on modules that couple signals and power supply connections from the chip to connection points, or ports, on the modules. Historically, wire bonds have frequently been used to couple signals and power from a chip to electrical conductors on the module, the electrical conductors thereby continuing the electrical continuity to the ports on the module. A more recent means to couple signals and power from a chip to electrical conductors on the module is accomplished with solder ball connections. The chip with solder balls attached is placed upon a module, with the solder balls being in contact with electrical conductors on the module. The combined unit is heated to a temperature at which the solder ball connections melt, completing the electrical chip/module interconnection. Upon cooling the combined unit, the solder re-hardens, making a good mechanical connection, as well as the electrical interconnection. The modules are mounted on, and further interconnected by, printed wiring boards (PWBs). There are a number of techniques that are used to couple signal and power between a module and a PWB. One such technique is to place connecting pins on the module, the connecting pins being coupled to the signal and power conductors on the module. Often, the pins are brazed or soldered on the bottom of the module. The module is placed on the PWB with the pins inserted into holes in the PWB. The holes are plated with electrically conducting material that is coupled to conductors on one or more layers of patterned, electrically conducting, material in the PWB. The PWBs have signal wiring on one or more electrically conducting layers that couple signals between the various module ports, as well as to connectors from which signals and power conductors are routed to other places in the computer system.

The electronic system also comprises an enclosure inside which the PWBs, power supplies, and other components are housed. The enclosure can be made of any suitable material, such as plastic or metal. Metal is commonly used for the enclosure in order that a system (chassis) voltage (commonly ground) can be coupled to a voltage used on the PWBs (commonly ground) to supply power to circuitry on the semiconductor chips. For most systems, coupling ground used by circuitry on the semiconductor chips to chassis ground provides a short return path for common mode current.

The PWBs must be held in their proper place in the enclosure. A traditional method of mounting PWBs in computer system enclosures and support structures has been the use of threaded fasteners, such as screws and bolts. While this method does provide secure holding of the PWB in position, and also provides positive electrical contact, it does present several problems as discussed below.

First, the assembly of these threaded fasteners can be time consuming and often requires the use of tools. Torque must be carefully controlled to prevent damaging the PWB.

Second, the use of such threaded fasteners affects the packaging design and can cause compromising the design by requiring sufficient clearances for the tools and drivers needed to secure the threaded fasteners.

Third, during field repairs, the fastener may be difficult to access. The fasteners may be dropped into the interior of the enclosure and cause damage if not retrieved. Proper torque settings may be difficult to control during field repairs, raising the likelihood of the field repairs causing further damage to the product.

Some electronic products require a first PWB to be mounted to a second PWB. The disclosed fastener is capable of fastening the first PWB to the second PWB. The second PWB can then further be mounted to the enclosure by additional uses of the disclosed fasteners.

Therefore, there is a need for a fastener that can quickly and reliably connect a PWB mechanically and electrically to an enclosure, or to another PWB, without the use of tools.

SUMMARY OF THE INVENTION

The present invention discloses a fastener that can fasten and hold a substantially flat, planar, object to the fastener within a predetermined range of force, providing reliable electrical connection between the object and fastener, without the use of tools.

In an embodiment, the fastener connects a printed wiring board (PWB) to an enclosure.

In an embodiment, the fastener connects a first PWB to a second PWB.

In an embodiment, a clamp lever comprises a built-in spring that maintains a predetermined range of force between the PWB and the mounting post.

In an embodiment, the clamp lever is connected with a pin to the mounting post, allowing the clamp lever to be pivoted from a first position, substantially longitudinal with the axis of the mounting post, to a second position, substantially orthogonal to the axis of the mounting post. The action of pivoting the clamp lever deforms the built-in spring, compressing the PWB against a shoulder on the mounting post. The deformation of the built-in spring places a predetermined range of force between the PWB and the shoulder of the mounting post even considering normal process variations in the thickness of the PWB.

In an embodiment, the mounting post is constructed of a conducting material, such as metal. The action of pivoting the clamp lever and compressing the built-in spring creates an electrical connection between an electrically conductive area on the PWB and the mounting post. Advantageously, the mounting post is further electrically coupled to a chassis of the computer enclosure, thus allowing reliable coupling between a supply voltage used in semiconductor chips in the computer system and the computer enclosure.

DETAILED DESCRIPTION OF THE PREFERRED EMBODIMENTS

Having reference now to the figures, the invention will now be described in detail.

Figure 1:
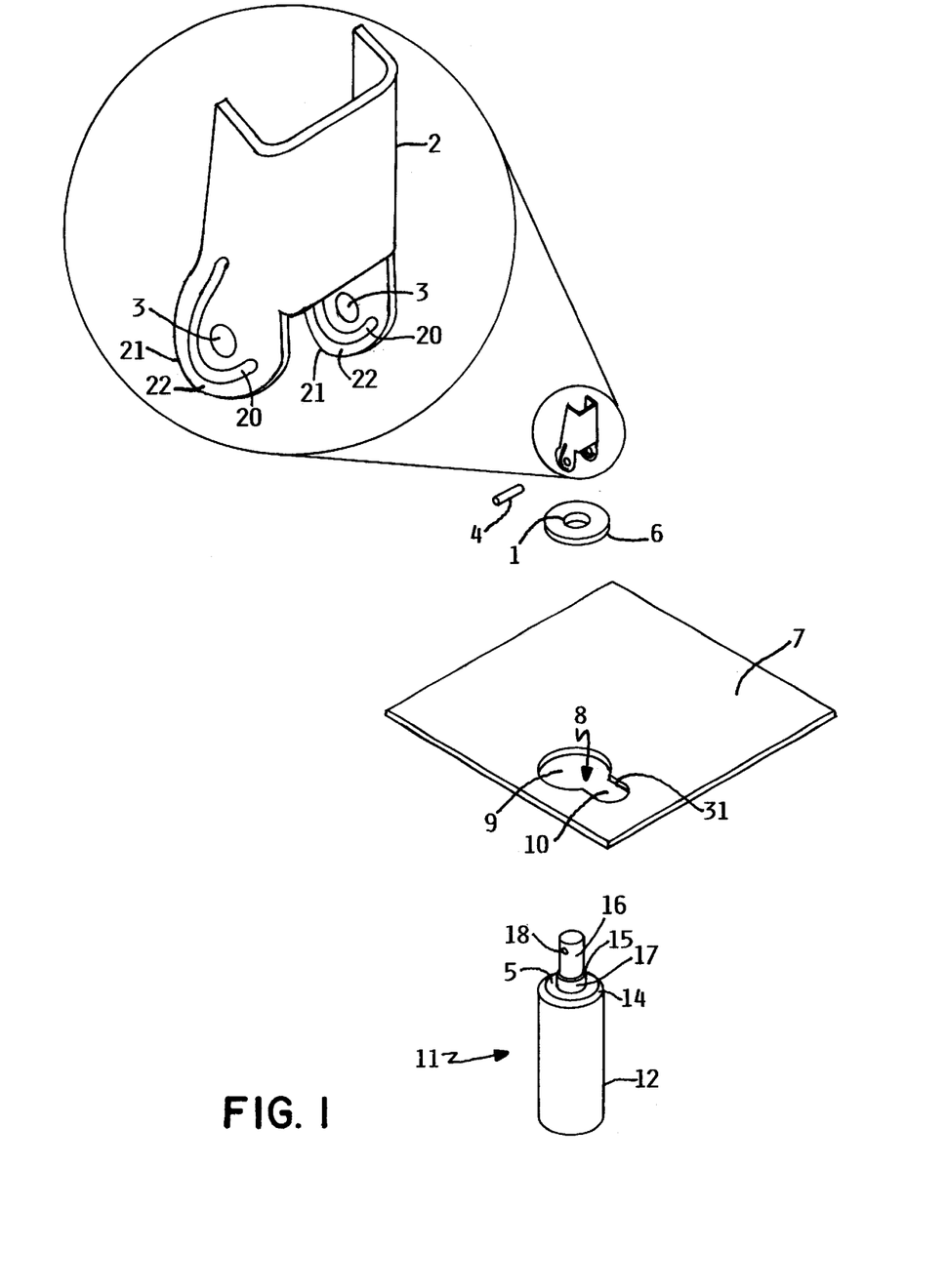
FIG. 1 shows an exploded view of the fastener of the current invention together with the Printed Wiring Board (PWB) that is being fastened.

Referring to FIG. 1, a Printed Wiring Board (PWB) 7 is to be fastened to mounting post 11. Although PWBs are used for exemplary purposes, the invention contemplates any substantially flat, planar object that needs to be fastened to mounting posts 11. Furthermore, the object only needs to be substantially flat and planar in the immediate vicinity of the clamp.

PWB 7 has one or more keyhole slots 8 which are openings in PWB 7. FIG. 1 shows one such keyhole slot 8 for simplicity. Most applications would have a number of keyhole slots 8 on PWB 7, for fastening to a number of mounting posts. Keyhole slot 8 comprises a larger portion 9 and a smaller portion 10.

Mounting post 11 comprises a substantially cylindrical standoff 12; a first shoulder 5; a substantially cylindrical section 17 that is coaxial with standoff 12 but which has a smaller diameter than standoff 12; a second shoulder 15; and a substantially cylindrical section 16 that is also coaxial with standoff 12. An optional chamfered section 14 can be used to reduce the diameter of standoff 12 to a smaller diameter of first shoulder 5. Cylindrical section 16 has a hole 18 going completely through cylindrical section 16.

Figure 8A:
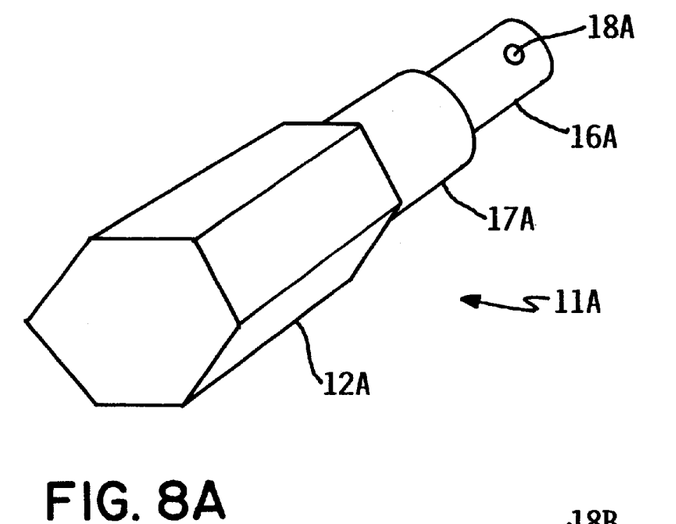
FIGS. 8A–8B show several embodiments of the standoff.
Figure 8B:
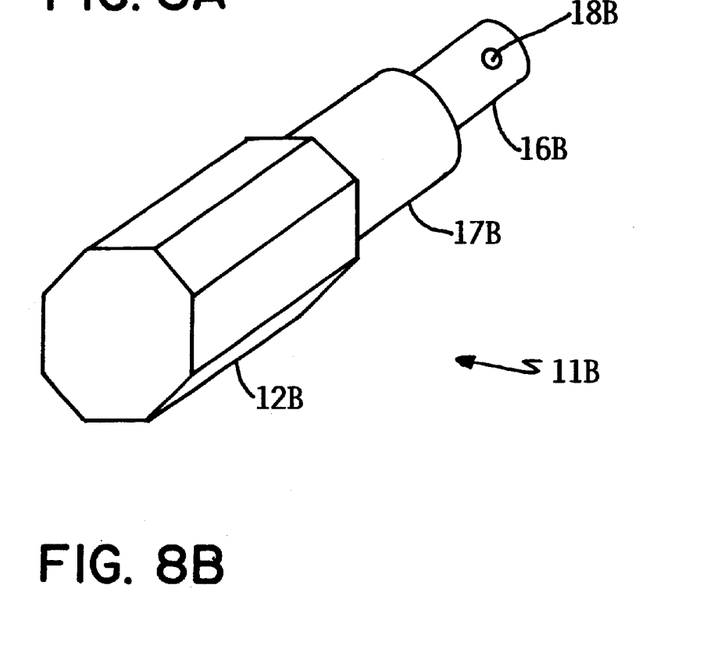

Note that whereas standoff 12 is advantageously substantially cylindrical in many embodiments, standoff 12 can be formed in alternative shapes, such as, for examples, hexagonally or octagonally along its axis for ease of gripping or turning in some embodiments described later, and as shown in FIGS. 8A and 8B.

Clamping ring 6, which will be described in more detail later, is coaxially and slideably placed over cylindrical section 16. Inner diameter I of clamping ring 6 is smaller than the diameter of cylindrical portion 17, which prevents clamping ring 6 from moving over cylindrical portion 17.

Clamp lever 2, also described in more detail later, is shaped such that clamping lever 2 can be pivotally attached to cylindrical portion 16 by means of a pin 4 that passes through holes 3 in clamping lever 2 and hole 18 in cylindrical section 16. The remaining elements shown in the expanded view of clamp lever 2 shown in FIG. 1 will be explained in more detail later.

Figure 2:
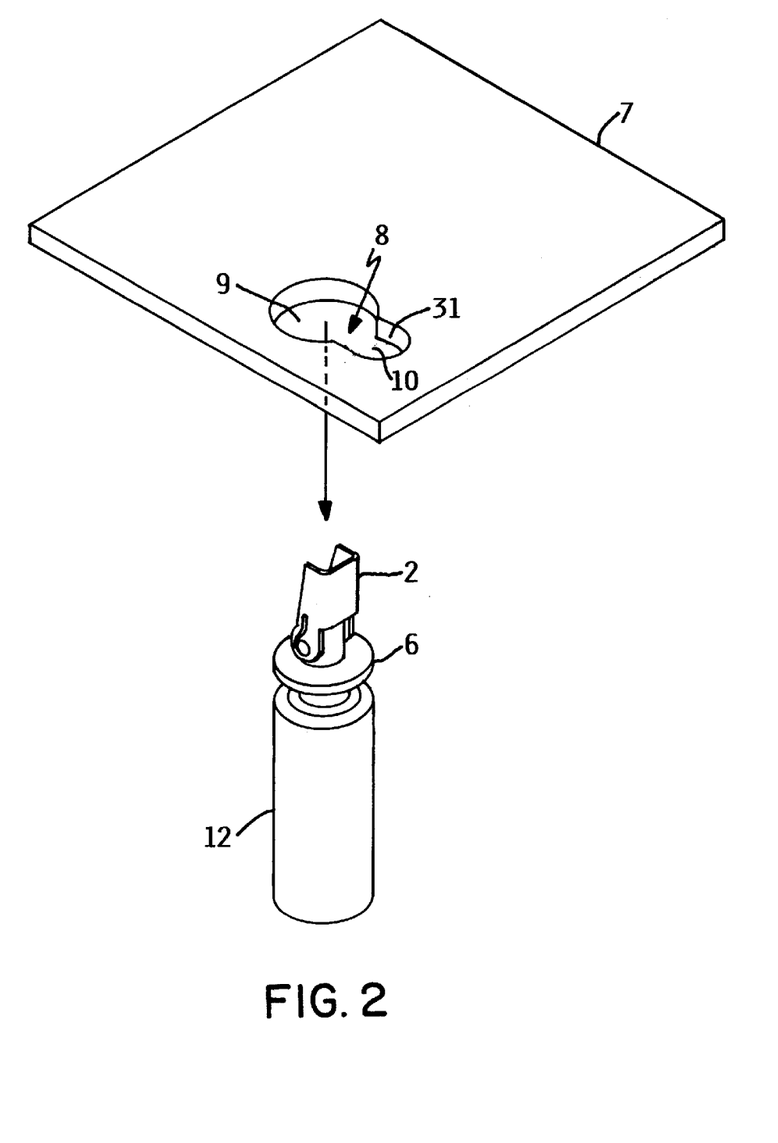
FIG. 2 shows a view of the fastener of the current invention being inserted through a keyhole slot in the PWB.

FIG. 2 shows PWB 7 being lowered onto the fastener. Clamp lever 2 and clamping ring 6 are small enough diameter as to pass freely through the larger portion 9 of keyhole slot 8. Although FIG. 2 shows PWB 7 being lowered onto the fastener, those skilled in the art will understand that motion of PWB 7 relative to the fastener is of importance. For example, the fastener could be moved into portion 9 of keyhole slot 8.

Figure 3:
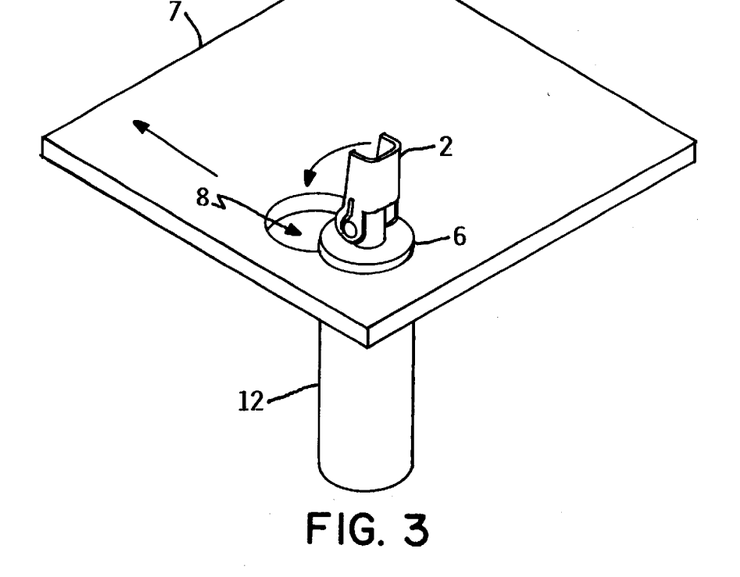
FIG. 3 shows a view of the fastener of the current invention placed in a narrow portion of the keyhole slot in the PWB.

FIG. 3 shows PWB 7 being moved horizontally such that cylindrical portion 17 (not viewable in this drawing) and a portion of cylindrical portion 16 (not viewable in this drawing) extend through smaller portion 10 (not viewable in this drawing) of keyhole slot 8. In this position, a portion of clamping ring 6 and some of first shoulder 5 overlap PWB 7. Again, relative motion between PWB 7 and the fastener is what is intended in the horizontal motion that places cylindrical portion 16 in smaller portion 10.

Figure 4:
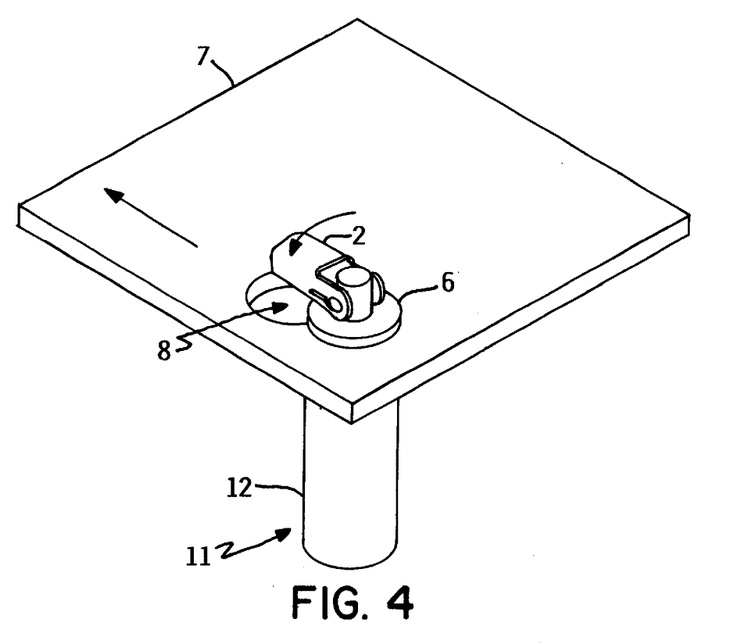
FIG. 4 shows a view of the fastener of the current invention placed in the narrow portion of the keyhole slot in the PWB, with the fastener actuated to clamp the PWB.

FIG. 4 shows clamp lever 2 being actuated by being pivoted from being substantially longitudinal with the axis of mounting post 11 to being substantially orthogonal to the axis of mounting post 11. This actuation will be described below.

FIGS. 5A–5F shows the fastener in more detail.

Figure 5A:
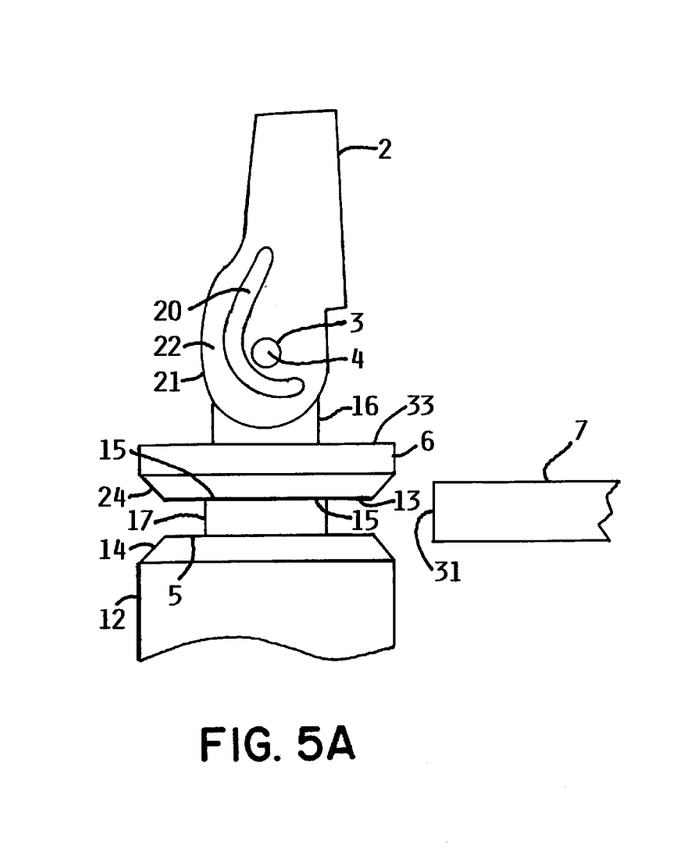
FIG. 5A shows a side view of the fastener near the side of the narrow portion of the keyhole slot in the PWB.

Clamp lever 2, shown in FIG. 5A, and, isometrically in the expanded view shown in FIG. 1, has a spring loaded engaging portion. The spring loaded engaging portion comprises a cutout 20, a spring element 22, and a spring edge 21. Cutout 20 is placed between hole 3 and a spring edge 21; spring edge 21 bears upon a top surface 33 of clamping ring 6 when clamp lever 2 is actuated by pivoting around pin 4 which is inserted in hole 3 in clamp lever 2 and also through hole 18 in cylindrical section 16 of mounting post 11. In the embodiment shown best in the expanded view of clamp lever 2 in FIG. 1, clamp lever 2 has two holes 3, two cutouts 20, two spring elements 22, and two spring edges 21. Other means to produce spring element 22 are within the spirit of the invention. Furthermore, while pin 4 inserted through holes 3 and 18 is a preferred embodiment, any means that allows clamp lever 2 to pivot is within the scope and spirit of this invention. For example, small cylinders could be brazed to cylindrical section 16, with holes 3 being placed on such small cylinders.

Clamping ring 6 is shown, in FIG. 5A, to rest upon second shoulder 15, the inner diameter 1 (see FIG. 1; inner diameter 1 is not visible in FIG. 5A) of clamping ring 6 being of smaller diameter than the diameter of cylindrical portion 17 of mounting post 11. Clamping ring 6 in this position is coaxially and slideably free to move between second shoulder 15 and clamp lever 2. Clamping ring 6 is shown to comprise chamfer 24. Standoff 12 is shown comprising chamfer 14.

Inner slot edge 31 is an edge of smaller portion 10 of keyhole slot 8 on PWB 7. The thickness of PWB 7 is greater than the distance between a bottom surface 13 of clamping ring 6 and a top surface of first shoulder 5, when clamping ring 6 rests upon second shoulder 15 as described earlier. As PWB 7 is slid horizontally as described above, clamping ring 6 is raised slightly as some of PWB 7 enters the space between the bottom surface 13 of clamping ring 6 and the top surface of first shoulder 5. Chamfers 24 and 14 facilitate ready movement of PWB 7 between the bottom surface 13 of clamping ring 6 and the top surface of first shoulder 5. In an embodiment, clamping ring is raised enough to cause some deformation of spring element 21 against a top surface 33 of clamping ring 6. In another embodiment, the top surface 33 of clamping ring 6 does not contact clamp lever 2 until clamp lever 2 is actuated.

In an embodiment, prior to actuation, clamp lever 2 is held in a position substantially longitudinal with the axis of mounting post 11 by friction between pin 4 and hole 3, as well as friction between pin 4 and hole 18. In another embodiment, some deformation of spring element 22 exists even when bottom surface 13 of clamping ring 6 rests upon second shoulder 15, in which case, friction between the top surface 33 of clamping ring 6 and clamp lever 2 holds clamp lever 2 in a position substantially longitudinal with the axis of mounting post 11.

Figure 5B:
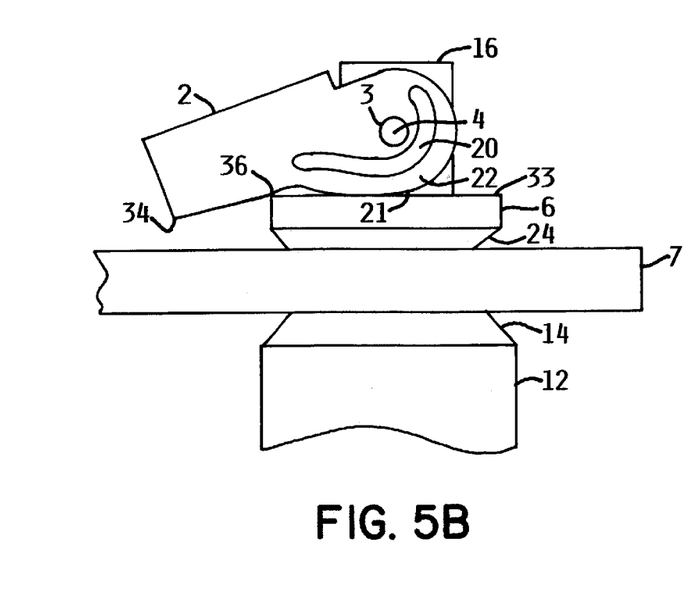
FIG. 5B shows a detailed side view of the fastener after actuation.

FIG. 5B shows clamp lever 2 actuated. Clamp lever 2 is actuated by pivoting clamp lever 2 around pin 4, which is inserted through holes 3 in clamp lever 2, as well as hole 18 in mounting post 11 (hole 18 not visible in FIG. 5B). As clamp lever 2 is pivoted, spring elements 22 are deformed, causing spring edges 21 to bear downward on the top surface 33 of clamping ring 6. As shown, pivoting action is stopped when stop edge 36 of clamp lever 2 comes into contact with clamping ring 6. Clamp lever 2 is thereby stopped from further pivoting before an end 34 of clamp lever 2 can come into contact with PWB 7.

Once actuated, clamp lever 2 remains actuated, held by friction between spring edges 21 and top surface 33 of clamping ring 6.

Several embodiments reduce the likelihood of clamp lever 2 becoming deactuated should the enclosure receive severe impact, such as if it were dropped.

Figure 5C:
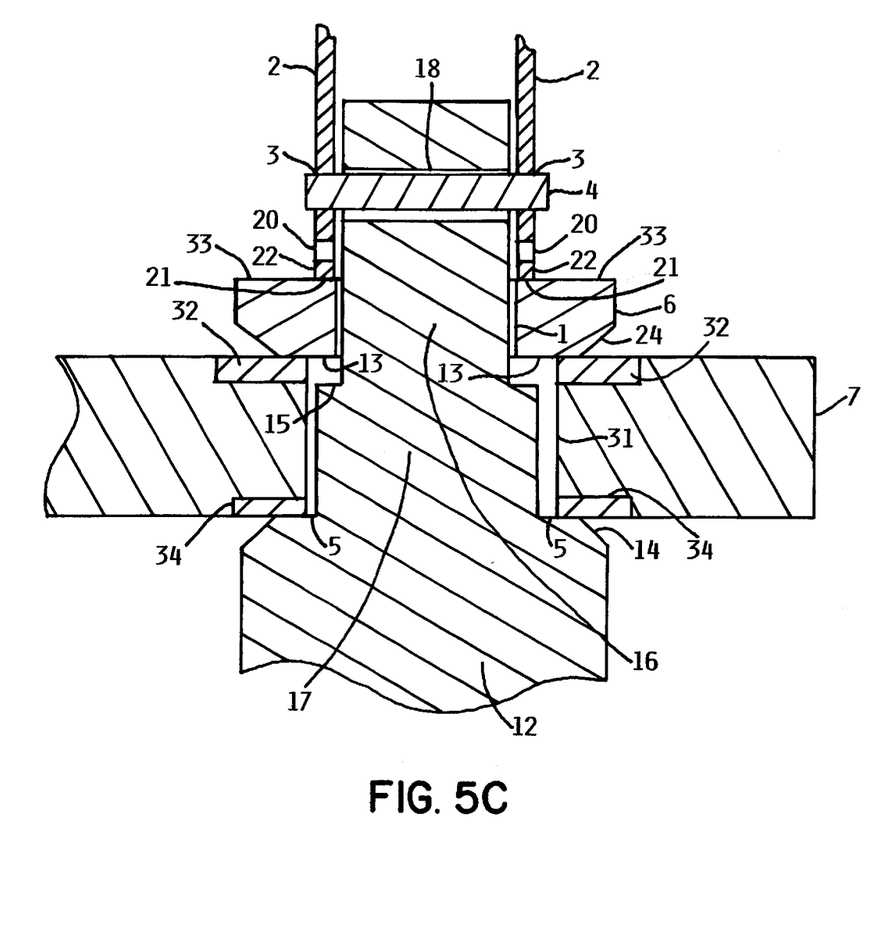
FIG. 5C shows a cutaway side view of a portion of the fastener after actuation, seen as turned 90 degrees from the views of FIGS. 5A and 5B.
Figure 5D:
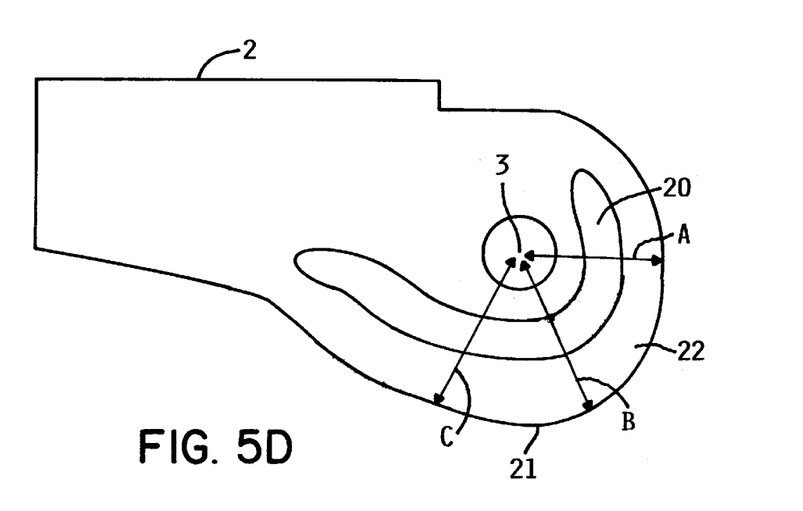
FIG. 5D shows a side view of a clamp lever designed to stay clamped when jarred.
Figure 5E:
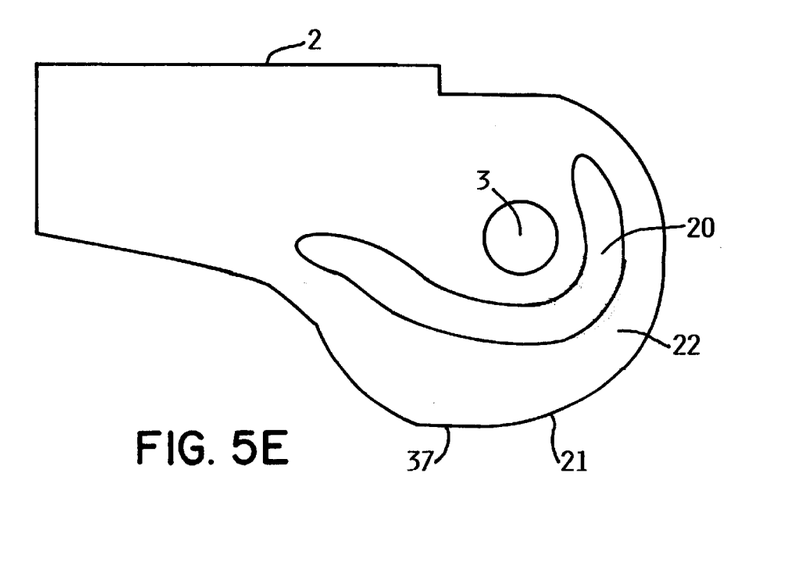
FIG. 5E shows another clamp lever designed to stay clamped when jarred.
Figure 5F:
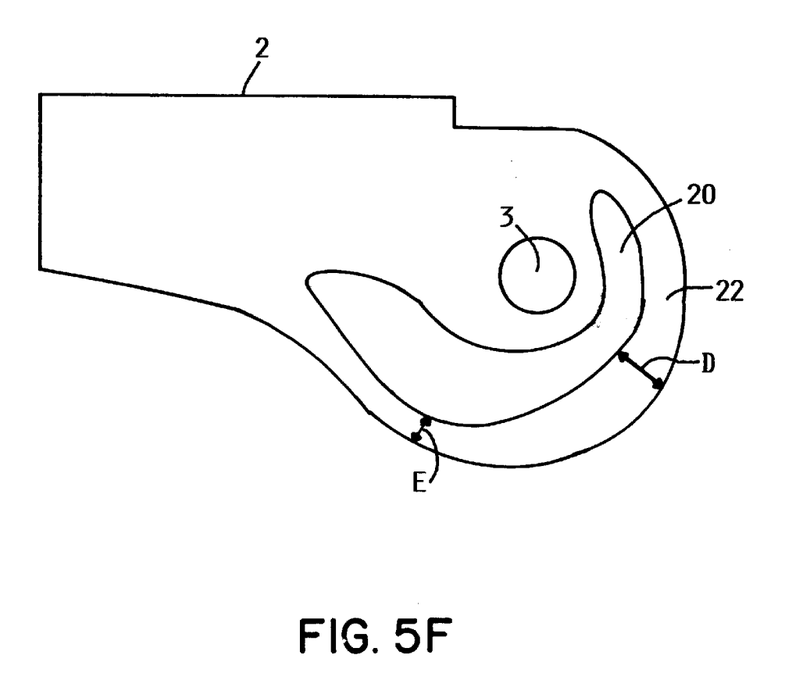
FIG. 5F shows another clamp lever designed to stay clamped when jarred.

In an embodiment, shown in FIG. 5F, spring elements 22 are shaped such that as clamp lever 2 is actuated, force bearing upon surface 33 increases, but then decreases as actuation is completed. Thinning the portion of spring elements 22 in the vicinity of contact (when clamp lever 2 is activated) between spring edges 21 and surface 33 produces this embodiment. As shown, spring element thickness E is less than spring element thickness D, thus requiring increasing force to be applied to cause clamp lever 2 to pivot clockwise in the figure once clamp lever 2 has been actuated.

Reducing the radius of curvature between hole 3 and spring edges 21 in the area where spring edges 21 contact surface 33 in the last small amount of actuation also produces this embodiment, and is shown in FIG. 5D. Radius B is larger than radius C. In this embodiment, increased force would have to act on clamp lever 2 to cause greater deformation of spring elements 22 during a de-actuation of clamp lever 2. Radius A is less than radius B and also less than radius C. Such latching action is sometimes called "over center" in the literature.

In another embodiment, shown in FIG. 5E, that enhances resistance to unintended de-actuation, a slightly flattened section 37 exists on spring edge 21 in the area of spring edge 21 that is in contact with surface 33 when clamp lever 2 is actuated. Again, significant force would have to act on clamp lever 2 to "climb the hill" needed to de-actuate the clamp lever.

Figure 9A:
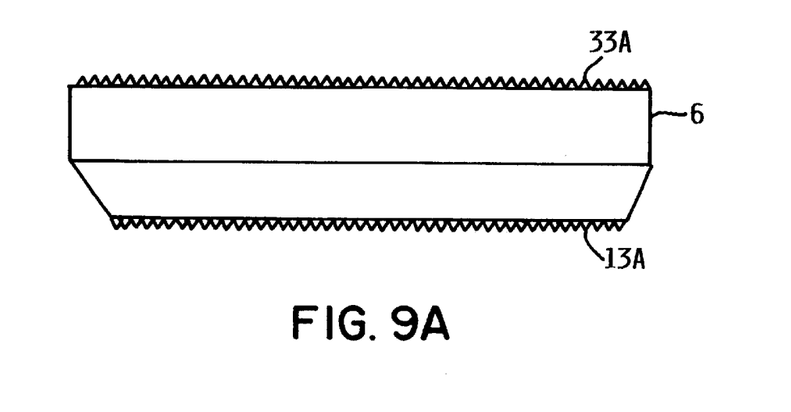
FIGS. 9A–9B show roughened surfaces on the clamping ring and a shoulder on the mounting post.
Figure 9B:
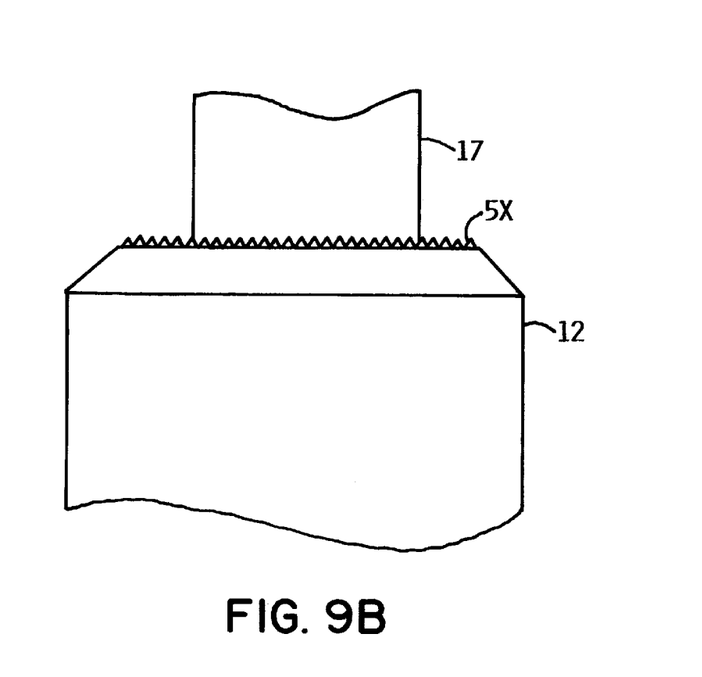

In yet another embodiment that enhances resistance to unintended deactuation, top surface 33A is roughened (shown in FIG. 9) to enhance friction between spring edges 21 and surface 33A. Chemical etching or machining are well-known techniques to roughen a surface.

FIG. 5C shows a cutaway view of the fastener holding PWB. This view is turned 90 degrees from the view of 5B, in order to show more clearly the relationship of clamp lever 2 with pin 4 and hole 18, as well as to show both spring elements and both cutouts.

Pin 4 is inserted in holes 3 of clamp lever 2, and also hole 18 in cylindrical section 16, allowing clamp lever 2 to pivot, as described earlier.

Cutouts 20 create spring elements 22, which bear, via spring edges 21, against top surface 33 of clamp ring 6 when clamp lever 2 is actuated. Spring edges 21 together with their respective spring elements 22 and cutouts 20 are considered together to be an embodiment of a spring loaded engaging portion of clamp lever 2. As spring edges 21 bear against top surface 33 of clamp ring 6, clamp ring 6 is forced against PWB 7, clamping PWB 7 between the bottom surface 13 of clamp ring 6 and the top surface of shoulder 5.

The force with which PWB 7 is clamped is determined by the spring constant of spring elements 22 and the degree of deformation of spring elements 22 as clamp lever 2 is actuated. A very high spring constant will limit the range of PWB thicknesses a particular design will accommodate; a lower spring constant will result in a more compliant spring that will accommodate a wider range in PWB thickness, as well as manufacturing tolerances in the thickness of the PWB. A lower spring constant can be obtained by making spring elements 22 thinner between spring edges 21 and cutouts 20, or making the material from which clamp lever 2 is constructed thinner or of a less stiff material. Spring elements 22 should be thick enough between spring edges 21 and cutouts 20 so as not to buckle when clamp lever 2 is actuated.

PWBs are often designed with electrically conducting material patterned on top and/or bottom surfaces of the PWB. Conductor 32 is shown to be on a top surface of PWB 7, and conductors 34 are shown to be on a bottom surface of PWB 7, as shown in FIG. 5C. Conductors 32 and 34 may be coplanar with the surfaces of PWB 7 as shown, or may rest upon the surfaces of PWB 7, and therefore extend outwards beyond the surfaces of PWB 7 by up to the thickness of conductors 32 and 34. Either a conductor coplanar on a surface of PWB 7 or a conductor formed upon a surface of PWB 7 is considered to be a conductor on a surface of PWB 7. Conductor 32 is an electrical conductor on the top surface of PWB 7, at or near edge 31 of smaller section 10 of keyhole slot 8. Advantageously, conductor 32 is routed along substantially the entire top surface of PWB 7 near edge 31. Conductor 32 is wide enough to make a low resistance electrical coupling between the bottom surface 13 of clamping ring 6 and conductor 32 when clamp lever 2 is actuated. In an embodiment wherein clamping lever 2, pin 4, and mounting post 11 are constructed of electrically conducting material, a low resistance path is thereby made between conductor 32 and mounting post 11. Similarly, conductor 34 is advantageously routed along substantially the entire bottom surface of PWB 7 near edge 31. Conductor 34 is wide enough to make a low resistance electrical coupling between shoulder 5 and conductor 34. In an embodiment wherein mounting post 11 is constructed of electrically conducting material, mounting post 11 is thus electrically coupled to conductor 34 upon actuation of the fastener. As stated earlier, it is often desirable to couple an electrical supply voltage, usually ground, on the PWB to the chassis of the electrical enclosure. A low resistance coupling between bottom surface 13 of clamping ring 6 and conductor 32 is enhanced by suitably roughening bottom surface 13, shown as surface 13A in FIG. 9A. Chemical etching or machining are well-known methods of roughening surfaces. Similarly, a low resistance coupling between shoulder 5 and conductor 34 is enhanced by suitably roughening shoulder 5, shown as shoulder 5X in FIG. 9B.

In an embodiment, only conductor 32 is provided on PWB 7. In another embodiment, only conductor 34 is provided on PWB 7. In another embodiment, both conductor 32 and conductor 34 are provided on PWB 7. It will be clear to one skilled in the art that, in an embodiment, conductor 32 is one strip of conductor running around the rim of smaller portion 10 of keyhole slot 8. Alternatively, in another embodiment, conductor 32 is a separate strip of conductor on the top surface of PWB 7 on one side, or each side, at, or near, the rim of smaller portion 10 of keyhole slot 8. Any conductor on the top surface of PWB 7 on or near the rim of smaller portion 10 of keyhole slot 8 which can be electrically contacted by bottom surface 13 of clamping ring 6 is contemplated. Similarly, conductor 34 can be any conductor on the bottom surface of PWB 7 at or near the rim of smaller portion 10 of keyhole slot 8 which can be electrically contacted by shoulder 5.

In an embodiment, clamping ring 6 is not used, with spring edges 21 bearing directly upon PWB 7. In this embodiment, tolerances and fastener orientation must be carefully managed to ensure that spring edges 21 bear upon the top surface of PWB 7 when actuated.

Figure 6A:
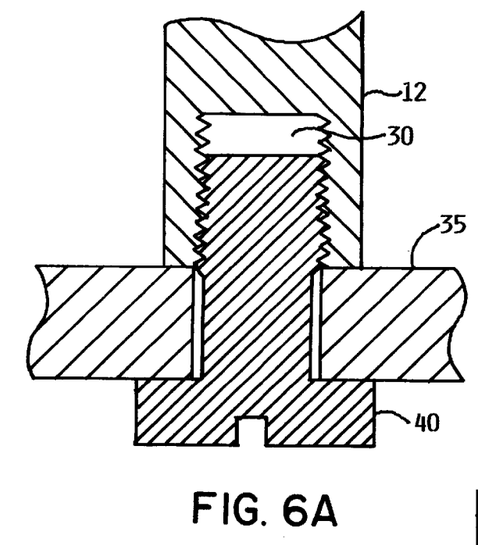
FIG. 6A shows a bottom portion of a mounting post of the fastener, attached to an enclosure by means of a screw threaded through the enclosure and into a tapped hole in the mounting post.

FIG. 6A shows a cutaway section of a bottom portion of standoff 12 in an embodiment of mounting post 11. A tapped hole 30 is shown in standoff 12. Threaded fastener 40, such as a screw or a bolt, can be used to fasten mounting post 11 to electrical enclosure 35 in a conventional manner, electrically coupling mounting post 11 to the electrical enclosure 35. Since, in an embodiment, mounting post 11 are electrically coupled to conductor 34, or to conductor 32, or to both conductor 34 and conductor 32, as described above, therefore electrical conductor 34 and/or conductor 32 are be electrically coupled to the chassis 35 as described above.

Figure 6B:
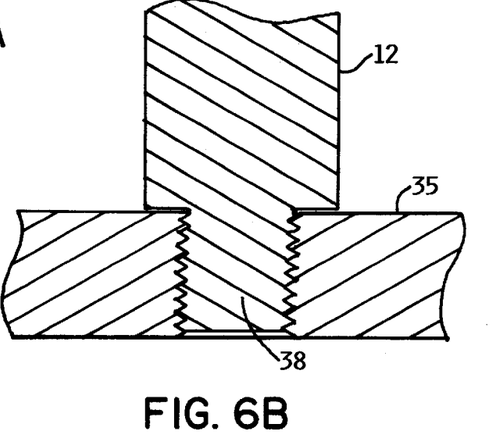
FIG. 6B shows a bottom portion of a mounting post of the fastener, comprising a screw that is part of the mounting post, the screw being threaded into the enclosure.

FIG. 6B shows another embodiment used to mechanically and electrically couple mounting post 11 to enclosure 35. In FIG. 6B, a threaded cylindrical extension 38 of standoff 12 of mounting post 11 is screwed into enclosure 35. In an embodiment, a portion of standoff 12 is advantageously formed such that a tool can be applied to screw the extension into a threaded hole in the enclosure. For example, as shown in FIGS. 8A and 8B, standoff 12 (shown as standoffs 12A and 12B, respectively) could be hexagonal or octagonal, rather than cylindrical, along the axis of standoff 12, facilitating turning by hand or by a tool. The term "diameter" in such shapes is commonly defined—and is intended here—as the distance between opposing flat sides. FIG. 8A shows a mounting post 11A featuring hexagonal standoff 12A. First cylindrical section 17A is similar to first cylindrical section 17 on previous embodiments. Second cylindrical section 16A, further containing first hole 18A are also similar to second cylindrical section 16 and first hole 18 of previous embodiments. FIG. 8B shows a mounting post 11B featuring octagonal standoff 12B. First cylindrical section 17B is similar to first cylindrical section 17 on previous embodiments. Second cylindrical section 16B, further containing first hole 18B are also similar to second cylindrical section 16 and first hole 18 of previous embodiments. Any embodiment of standoff 12 that facilitates attachment to enclosure 35 is within the spirit and scope of this invention, including, but not limited to, widening a portion of standoff 12 for grasping, and flattening a portion of standoff 12. In an embodiment, a lock washer (not shown) is placed between standoff 12 and enclosure 35. In a further embodiment (not shown), threaded extension 38 extends completely through enclosure 35 and a nut and, optionally, a lock washer is placed on the end of threaded extension 38.

Figure 6C:
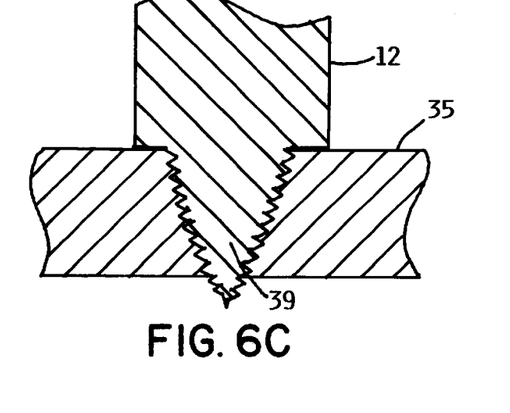
FIG. 6C shows a bottom portion of a mounting post of the fastener, comprising a sheet metal screw extension that is part of the mounting post.

In an embodiment shown in FIG. 6C, threaded extension 39 is formed as a sheet metal screw capable of threading itself into the enclosure, the sheet metal screw being tapered, with the larger diameter end of the sheet metal screw at the end where the sheet metal screw 39 and standoff 12 meet.

FIGS. 7A–7D show several ways in which pin 4 can be retained in holes 3 of clamp lever 2 and hole 18 (not visible in these figures) in cylindrical portion 16 of mounting post 11.

Figure 7A:
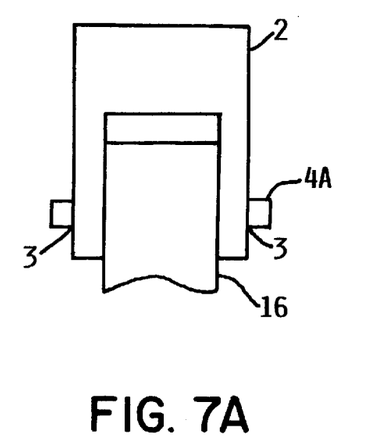
FIGS. 7A–7D show several embodiments of pin retention techniques.

FIG. 7A shows pin 4A inserted in holes 3 and hole 18 (hole 18 not visible in this view). In this embodiment, the diameter of pin 4A closely matches the diameter of hole 18, the diameters of holes 3, or the diameter of hole 18 and the diameters of holes 3. With a suitably tight fit, friction between pin 4A and holes 3 and hole 18 keeps pin 4A inserted.

Tightness of fit can be increased through known techniques such as "shrink fitting". For example, in an embodiment, pin 4A is cooled, inserted through holes 3 and hole 18. In this embodiment, cold pin 4A fits in holes 3 in warmer clamp lever 2, but with very little difference in diameters between the diameter of pin 4A and the diameters of holes 3. In this embodiment, pin 4A fits freely in hole 18. As pin 4A warms relative to clamp lever 2, pin 4A becomes tightly held in holes 3. In an alternative embodiment, cylindrical section 16 of mounting post 11 is heated prior to assembly, thereby enlarging hole 18 relative to cooler pin 4A. As mounting post 11 is cooled, hole 18 will shrink, providing a tight fit with pin 4A. These embodiments of shrink fitting are exemplary only, and any combination of heating or cooling pin 4A, mounting post 11, and clamp lever 2 is contemplated.

Figure 7B:
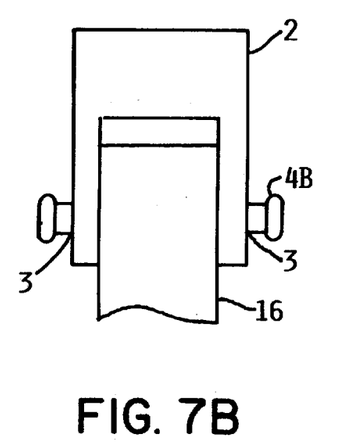

FIG. 7B shows an embodiment of pin 4B, wherein the opposite ends of pin 4B are made larger following insertion in holes 3 and hole 18. Impacts, especially impacts when pin 4B is heated can produce such a bulbous shape on the ends of pin 4B. If the maximum width of pin 4B is larger than the diameter of holes 3, pin 4B will be retained in position.

Figure 7C:
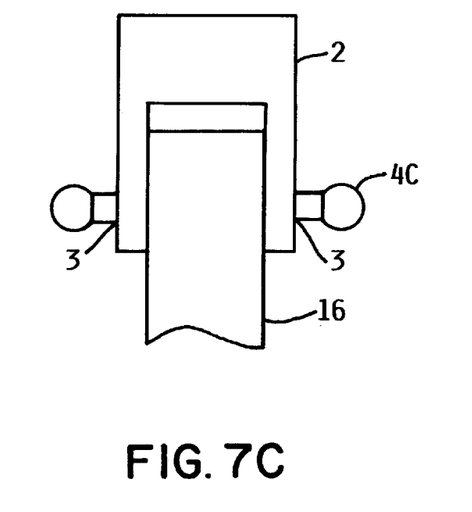

FIG. 7C shows an embodiment of pin 4C, wherein the two ends of pin 4C are crimped after insertion in holes 3 and hole 18, flattening portions of pin 4C, but expanding the width in the direction of the crimp. If the maximum width of pin 4C is larger than the diameter of holes 3, pin 4C will be retained in position.

Figure 7D:
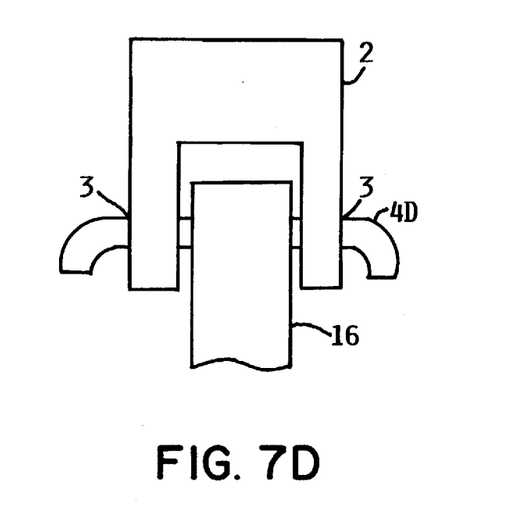

FIG. 7D shows an embodiment of pin 4D, wherein the two ends of pin 4D are bent after insertion in holes 3 and hole 18. The bending of pin 4D as shown is sufficient to retain pin 4D in position.

Figure 10A:
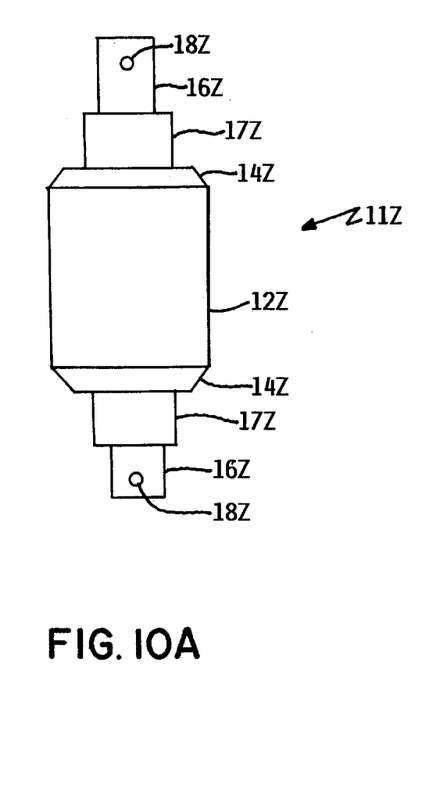
FIG. 10A shows an embodiment of a mounting post suitable for having two clamp levers.
Figure 10B:
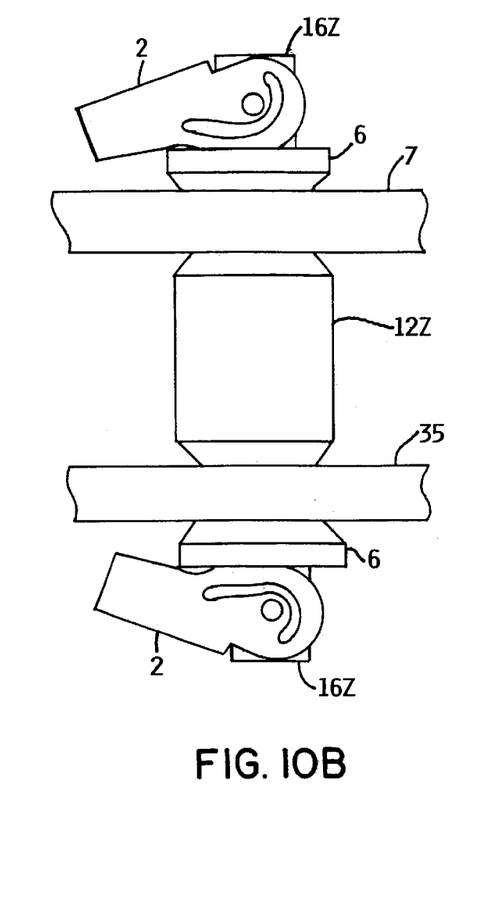
FIG. 10B shows two objects clamped to the mounting post of FIG. 10A.

The above descriptions explained in detail how a clamp lever 2 can be actuated to fasten an object to a mounting post 11 with a spring loaded engagement portion, exemplarily shown comprising a spring element 22, a cutout 20, and a spring edge 21. FIG. 10A shows a further embodiment wherein mounting post 11Z comprises a standoff 12Z that has an optional chamfer 14Z at one or both ends, two first cylindrical sections 17Z, two second cylindrical sections 16Z, and two holes 18Z. This embodiment allows mounting post 11Z to be fastened to enclosure 35 in the same manner that PWB 7 is fastened to mounting post 11Z, as shown in FIG. 10B, that is, exactly the same as PWB 7 was fastened to mounting post 11 as described earlier. Fastening two PWBs 7 to mounting post 11 is within the spirit and scope of the invention, as well as clamping one PWB 7 and one enclosure 35. Furthermore, when two PWBs 7 are fastened to a mounting post, the combined unit can be fastened to enclosure 35 with the invented fastener simply by having one or more keyhole slots in the PWB 7 nearest the enclosure and fastening that PWB 7 to enclosure 35 as described earlier.

While the present invention has been described with reference to the details of the embodiments of the invention shown in the drawings, these details are not intended to limit the scope of the invention as claimed in the appended claims.

What is claimed is:

1. A fastener comprising:
   a mounting post having a first shoulder; and
   a clamp lever, having a spring loaded engaging portion, pivotally attached to the mounting post, for movement between a clamped position and an unclamped position; wherein, said spring loaded portion formed in said clamp lever comprising a cutout forming a spring element with a spring edge;
   wherein an object is clamped under spring loading by the spring loaded engaging portion of the clamp lever.

2. The fastener of claim 1, wherein the mounting post is made of an electrically conducting material.

3. The fastener of claim 2, further comprising a clamping ring having an inner diameter and an outer diameter; wherein the clamp lever and the clamping ring are made of an electrically conducting material.

4. The fastener of claim 1, further comprising a clamping ring.

5. The fastener of claim 4, wherein the mounting post further comprises:
   a standoff having a first diameter;
   a first cylindrical section having a second diameter, the second diameter less than the first diameter; the first shoulder being between the standoff and the first cylindrical section, the second diameter being larger than an inner diameter of the clamping ring;
   a second cylindrical section having a third diameter, the third diameter less than the second diameter, the third diameter being smaller than the inner diameter of the clamping ring;
   a second shoulder which joins the second cylindrical section with the first cylindrical section; and
   a first hole in the second cylindrical section of diameter suitable to allow the pin to be inserted into the hole.

6. The fastener of claim 5, wherein the standoff further comprises a tapped hole in a first end.

7. The fastener of claim 5, wherein the standoff further comprises a cylindrical, threaded section extending from a first end of the standoff.

8. The fastener of claim 7, wherein the cylindrical, threaded section is tapered, with a larger diameter where the cylindrical, threaded section joins the standoff.

9. The fastener of claim 5, wherein a chamfer is placed between the standoff and the first shoulder.

10. The fastener of claim 5, wherein the standoff is substantially cylindrical about its longitudinal axis.

11. The fastener of claim 5, wherein the standoff post is hexagonal about its longitudinal axis.

12. The fastener of claim 5, wherein the standoff is octagonal about its longitudinal axis.

13. The fastener of claim 5, wherein the clamp lever further comprises:
   a second hole through which the pin can be inserted, the pin also being inserted through the first hole in the second cylindrical section of the mounting post;
   a cutout that creates a spring section;
   a spring edge that bears against a top surface of the clamping ring when the clamp lever is pivoted around the pin; and
   a stop edge that contacts the clamping ring, thus preventing the clamp lever from pivoting around the pin far enough such that the clamp lever contacts the planar object.

14. The fastener of claim 13, wherein the clamp lever further comprises a flattened portion on the spring edge that is in contact with the top surface of the clamping ring when the clamp lever is actuated.

15. The fastener of claim 13, wherein the top surface of the clamping ring is roughened.

16. The fastener of claim 13, wherein the spring edge provides an increasing force on the top surface of the clamping ring for a portion of de-actuation of the clamp lever.

17. The fastener of claim 4, wherein the clamping ring has a chamfer.

* * * * *